United States Patent
Tashiro et al.

(10) Patent No.: US 7,872,231 B2
(45) Date of Patent: Jan. 18, 2011

(54) SAMPLE RELOCATION METHOD IN CHARGED PARTICLE BEAM APPARATUS AND CHARGED PARTICLE BEAM APPARATUS AS WELL AS SAMPLE FOR TRANSMISSION ELECTRON MICROSCOPE

(75) Inventors: Junichi Tashiro, Chiba (JP); Masanao Munekane, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 387 days.

(21) Appl. No.: 12/047,022

(22) Filed: Mar. 12, 2008

(65) Prior Publication Data
US 2008/0302961 A1 Dec. 11, 2008

(30) Foreign Application Priority Data
Mar. 13, 2007 (JP) ............................. 2007-063551

(51) Int. Cl.
*G01N 23/00* (2006.01)
(52) U.S. Cl. .................. 250/310; 250/306; 250/307; 250/440.11; 250/442.11
(58) Field of Classification Search ................. 250/306, 250/307, 440.11, 442.11
See application file for complete search history.

(56) References Cited

U.S. PATENT DOCUMENTS

| 3,952,203 | A | * | 4/1976 | Hoppe | 250/442.11 |
|---|---|---|---|---|---|
| 5,012,109 | A | * | 4/1991 | Shichi et al. | 250/491.1 |
| 5,270,552 | A | * | 12/1993 | Ohnishi et al. | 250/307 |
| 5,783,830 | A | * | 7/1998 | Hirose et al. | 250/492.21 |
| 6,262,802 | B1 | * | 7/2001 | Kiyono | 356/616 |
| 7,550,750 | B2 | * | 6/2009 | Tokuda et al. | 250/492.21 |
| 2004/0178355 | A1 | * | 9/2004 | Rasmussen | 250/442.11 |
| 2005/0178980 | A1 | * | 8/2005 | Skidmore et al. | 250/492.21 |
| 2007/0023684 | A1 | * | 2/2007 | Lewis et al. | 250/442.11 |
| 2008/0009434 | A1 | * | 1/2008 | Reches et al. | 514/2 |
| 2008/0067385 | A1 | * | 3/2008 | Tokuda et al. | 250/310 |
| 2008/0156770 | A1 | * | 7/2008 | Munekane | 216/66 |
| 2008/0308727 | A1 | * | 12/2008 | Boguslavsky et al. | 250/307 |

FOREIGN PATENT DOCUMENTS

| JP | 8-192382 A | 7/1996 |
|---|---|---|
| JP | 8-257926 A | 10/1996 |
| JP | 3109220 B | 9/2000 |
| JP | 2003-65905 A | 3/2003 |
| JP | 3495037 B | 11/2003 |

\* cited by examiner

*Primary Examiner*—Bernard E Souw
*Assistant Examiner*—Michael Maskell
(74) *Attorney, Agent, or Firm*—Brinks Hofer Gilson & Lione (57) ABSTRACT

In a chamber of a charged particle beam apparatus, the sample on the sample substrate is gripped and carried to the sample holder, and there is controlled the attitude of the sample when the sample is fixed on the sample holder. There possesses a marking process applying, in the chamber, a marking to a surface of the sample Wb existing on the sample substrate by a beam, a carriage process gripping the sample by a sample gripping means and carrying it from the sample substrate to the sample holder, and an attitude control process controlling, when fixing the sample to the sample holder, the attitude of the sample while observing the marking applied to the surface of the sample.

13 Claims, 5 Drawing Sheets

SAMPLE RELOCATION METHOD IN CHARGED PARTICLE BEAM APPARATUS AND CHARGED PARTICLE BEAM APPARATUS AS WELL AS SAMPLE FOR TRANSMISSION ELECTRON MICROSCOPE

RELATED APPLICATIONS

This application claims priority under 35 U.S.C. §119 to Japanese Patent Application No. JP2007-063551 filed Mar. 13, 2007, the entire content of which is hereby incorporated by reference.

BACKGROUND OF THE INVENTION

The present invention relates to a sample relocation method in a charged particle beam apparatus and the charged particle beam apparatus automatically implementing this method as well as a sample for a transmission electron microscope.

In recent years, following upon a pattern micronization of a semiconductor device, there is studied the fact that a specified micro part of the semiconductor device is observed by a transmission electron microscope (hereafter, also called TEM) to thereby evaluate it or perform thereafter an additional working, and it is partially implemented.

In order to observe the specified micro part of the semiconductor device by the TEM, there becomes necessary a sample making work in which a sample is made by irradiating a charged particle beam to a surface of a sample substrate to thereby separate the specified micro part, and this sample is detached from the sample substrate by using a manipulator and moved, and fixed onto a sample holder for an observation.

Hitherto, in a case where the sample made on the surface of the sample substrate is carried to the sample holder, a probe is mainly used. In a sample carriage by the probe, there is an issue that it becomes necessary to bond the sample to the probe by a deposition or the like and, because of this bonding work, a work efficiency decreases and further a work time becomes long.

As one solving these issues, recently there is developed the fact that the sample is grip-carried by using a minute sample-gripping means called a so-called nano-pincette, which comprises one pair of left/right arms (e.g., refer to Patent Documents JP-A-8-257926 Gazette, JP-A-8-192382 Gazette, Japanese Patent No. 3109220 Gazette, JP-A-2003-65905 Gazette, and Japanese Patent No. 3495037 Gazette).

The technique of the minute sample-gripping means described in the above Patent Documents is roughly classified to one in which the left/right arms are simultaneously driven by a drive means such as electrostatic actuator, electromagnetic drive or oil pressure (the Patent Documents JP-A-8-257926 Gazette, JP-A-8-192382 Gazette, Japanese Patent No. 3109220 Gazette, Japanese Patent No. 3495037 Gazette), and one in which, without the left/right arms being simultaneously driven by the drive means, only one arm between them is driven (the Patent Document JP-A-2003-65905 Gazette).

In a case of the former of one in which the left/right arms are simultaneously driven, although an operation is easy, an attitude of the gripped sample depends on a gripped face of the sample and a shape of the sample.

Further, in a case of the latter of one in which the left/right arms are not simultaneously driven, although it is possible to control the attitude of the sample, there is a defect that the operation is not stable because the gripped attitude is unstable.

By the way, in a case fixing the sample onto the sample holder, if the sample exists in the same state as a state in which it originally existed on the sample substrate, in other words, e.g., if an upper face of the sample is perpendicular to the charged particle beam on the sample substrate, also when it is fixed onto the sample holder, it is necessary that the sample is fixed with the upper face of the sample being held perpendicularly to the charged particle beam intact.

However, in a grip carriage method of the sample, in which the mere minute sample-gripping means mentioned above is used, it is an actual circumstance that the an attitude of the sample depends on the gripped face and the shape of the sample, or there is the fact that, from such a reason that an operation is not stable, the attitude of the sample on the sample holder deviates from the state in which the sample was originally placed on the sample substrate and, further in a case where the attitude of the sample on the sample holder deviates like this, the method does not have a correction means suitable for returning it to the original state.

The present invention is one made by considering the circumstances like these, and its object is to provide a sample relocation method in a charged particle beam apparatus and a charged particle beam apparatus, in each of which an attitude of a sample in a sample-relocated place can be held to the same state as the attitude of the sample before being relocated, as well as a sample for a transmission electron microscope.

SUMMARY OF THE INVENTION

A sample relocation method in a charged particle beam apparatus of the present invention is characterized by possessing a marking process applying a marking to a sample by a beam; a carriage process gripping the sample by a sample gripping means and carrying it to a sample-relocated place; and an attitude control process controlling an attitude of the sample while observing the marking applied to the sample.

According to the sample relocation method in the charged particle beam apparatus of the present invention, since an attitude control of the sample in the sample-relocated place is performed on the basis of the marking applied to the sample before being relocated, resultantly as to the attitude of the sample, the attitude of the sample before being relocated can be reproduced.

In other words, e.g., if an upper face of the sample is perpendicular to an ion beam before being relocated, the sample is attitude-controlled such that the upper face of the sample is held perpendicularly to the ion beams also after being relocated.

Therefore, e.g., the sample is attached to the sample-relocated place under the same state as when worked as a sample substrate by the charged particle beam apparatus, and this attached sample can be observed by the TEM for instance. Further, thereafter, it is possible to addition-work by the charged particle beam apparatus.

In a sample relocation method in a charged particle beam apparatus of the present invention, it is desirable that, in the marking process, the marking is applied at least to a side face of the sample.

By this, in a case where the charged particle beam is irradiated toward a vertical direction from just above the sample, the attitude control of the sample along the vertical direction becomes possible.

In a sample relocation method in a charged particle beam apparatus of the present invention, it is desirable that, in the marking process, the marking is applied by an etching or a deposition.

In this case, the etching or the deposition, which uses the charged particle beam, is a technique ordinarily used and, since the marking is applied on the basis of this technique ordinarily used, a stable attitude control of the sample is possible.

In a sample relocation method in a charged particle beam apparatus of the present invention, it is desirable that, in the attitude control process, the attitude of the sample is controlled by relatively moving, under a state in which a lower face of the sample was butted against the sample-relocated place, an upper part of the sample in regard to the sample-relocated place by the sample gripping means.

In this case, it is never necessary to change an angle of the sample gripping means itself, and the attitude of the sample can be changed only by moving parallel the sample gripping means along an installation face of the sample-relocated place. Therefore, the attitude control becomes very easy.

In a sample relocation method in a charged particle beam apparatus of the present invention, it is desirable that the carriage process grips the sample by the sample gripping means, and carries it from a sample substrate to a sample holder which is the sample-relocated place.

In this case, it is possible to carry the sample from the sample substrate to the sample holder and, therefore, it is possible to apply an observation or an additional working to the sample by treating, as the sample, the specified micro part of the semiconductor device, which was made or halfway made in the sample substrate, and fixing it to the sample holder.

In a sample relocation method in a charged particle beam apparatus of the present invention, it is desirable that, in the attitude control process, an observation of the marking applied to the sample uses a beam lens-barrel used when marking in the marking process and a beam irradiated from the same beam lens-barrel.

In this case, as to the beam lens-barrel used when marking and the beam lens-barrel used when observing, since the same one is used, it is possible to control the attitude of the sample in the sample-relocated place at a high accuracy so as to coincide with the attitude of the sample before being relocated.

A charged particle beam apparatus of the present invention is characterized by possessing a marking means applying a marking to a sample by a beam; a sample gripping means gripping the sample and carrying it to a sample-relocated position; an observation means observing the marking applied to the sample; and a control means controlling an attitude of the sample by relatively moving, on the basis of an observation result by the observation means, the sample gripping means in regard to the sample-relocated place.

According to this charged particle beam apparatus, it is possible to easily implement the above-mentioned method invention of claim 1 without depending on an operator's ability.

A charged particle beam apparatus of the present invention is a charged particle beam apparatus in which, in a chamber of the charged particle beam apparatus, a sample on a sample substrate is gripped and carried to a sample holder, and there is controlled an attitude of the sample when the sample is fixed on the sample holder, characterized by possessing a marking means applying, in the chamber, a marking to a surface of the sample existing on the sample substrate by a beam; a sample gripping means gripping the sample and carrying it from the sample substrate to the sample holder; an observation means observing, on the sample holder, the marking applied to the surface of the sample; and a control means controlling an attitude of the sample by relatively moving, on the basis of an observation result by the observation means, the sample gripping means in regard to the sample holder.

According to this charged particle beam apparatus, it is possible, in the chamber, to easily attach the sample existing on the sample substrate without depending on the operator's ability by carrying the sample to the sample holder, while holding there the same attitude as the attitude in which it existed on the sample substrate. It can be automatically attached.

A charged particle beam apparatus of the present invention is characterized in that the control means controls the attitude of the sample by finding, on the basis of the observation result by the observation means, an attitude deviation quantity of the sample, finding, from the attitude deviation quantity, a necessary movement quantity of the sample gripping means, and relatively moving, on the basis of the necessary movement quantity, the sample gripping means in regard to the sample holder.

According to this charged particle beam apparatus, the attitude deviation quantity of the sample by a marking observation is found, and the attitude control of the sample is performed on the basis of that attitude deviation quantity, so that eventually it is possible, by nullifying the attitude deviation quantity, to easily control the sample without depending on the operator's ability so as to coincide with the attitude before being relocated.

A charged particle beam apparatus of the present invention is characterized in that a beam lens-barrel used when marking by the marking means and a beam lens-barrel used when observing, by the observation means, the marking applied to a surface of the sample are the same beam lens-barrel.

According to this charged particle beam apparatus, as to the beam lens-barrel used when marking and the beam lens-barrel used when observing, since the same one is used, it is possible to automatically control the attitude of the sample in the sample-relocated place at the high accuracy so as to coincide with the attitude of the sample before being relocated.

A sample for a transmission electron microscope of the present invention is characterized in that a marking for an attitude control is applied to its side face by a beam of a charged particle beam apparatus.

By using this sample for the transmission electron microscope, it is possible to suitably implement the above-mentioned method inventions recited in the claims.

According to the present invention, as to the attitude of the sample in the sample-relocated place, it is possible to reproduce the attitude under a state in which the sample was placed before being relocated. Therefore, e.g., under the same state as when there was worked by the charged particle beam apparatus, it is possible to attach the sample to the sample-relocated place, and it is possible to observe the sample by the TEM for instance, and further it is possible to addition-work by the charged particle beam apparatus.

DETAILED DESCRIPTION OF THE PREFERRED EMBODIMENTS

Hereunder, by using the drawings, there are explained embodiments of a sample relocation method in a charged particle beam apparatus and a charged particle beam apparatus as well as a sample for a transmission electron microscope, which are concerned with the present invention.

Figure 1:
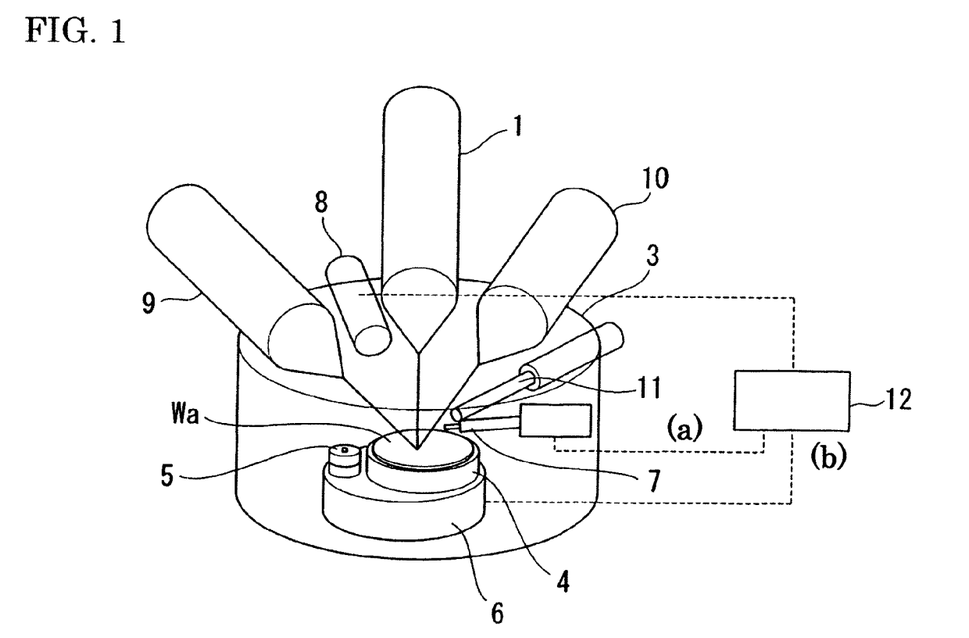
FIG. 1 is a schematic view showing a constitution of a sample attitude control mechanism in a focused ion beam apparatus concerned with the present invention.
Figure 2:
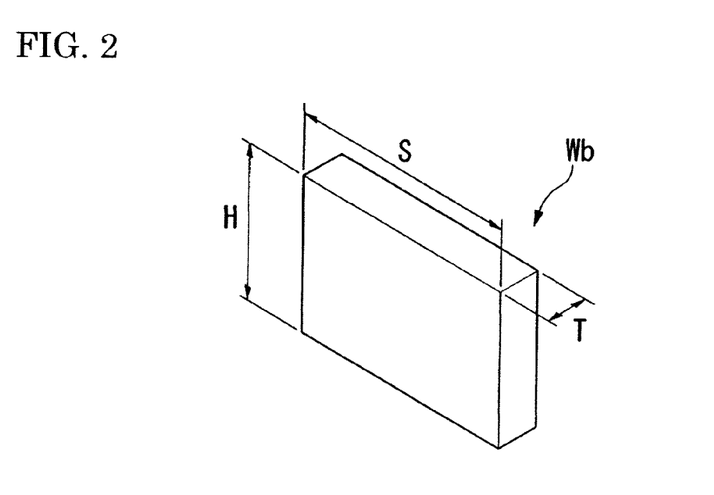
FIG. 2 is a perspective view of a sample becoming an attitude control object.
Figure 3:
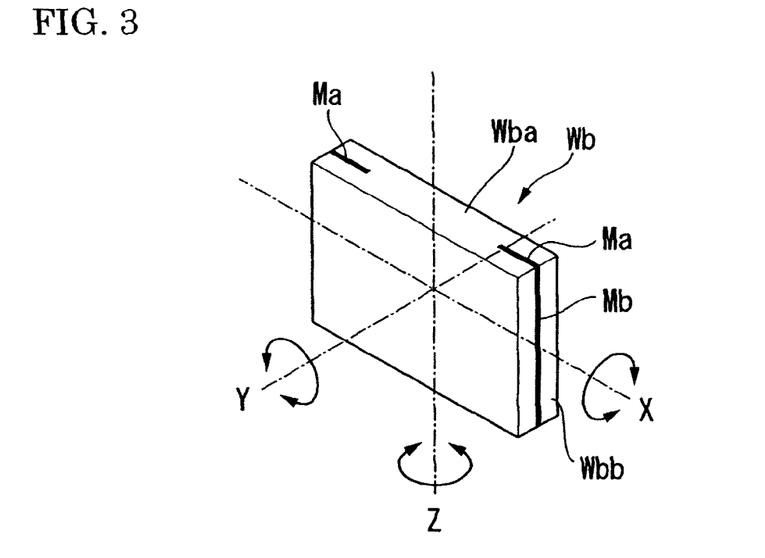
FIG. 3 is a perspective view showing a state in which a marking was applied to the sample becoming the attitude control object.

FIG. 1 is a perspective view showing a whole, schematic constitution of the focused ion beam apparatus which is one example of the charged particle beam apparatus, FIG. 2 a perspective view of a sample, and FIG. 3 a perspective view denoting a state in which a marking was applied to the sample.

In FIG. 1, a reference numeral 1 is a focused ion beam lens-barrel. From here, a focused ion beam is discharged into a vacuum chamber 3. In a position in the vacuum chamber 3 and below the focused ion beam lens-barrel 1, a sample base 4 for mounting a sample substrate Wa, such as semiconductor wafer for instance, which is a working object article or an observation object article, and a sample holder 5 for holding a sample Wb made from the sample substrate Wa are supported so as to operate respectively, independently in three-axis directions of XYZ, which mutually, perpendicularly intersect and so as to be movable by the sample stage 6 rotating about a Z-axis.

Figure 4:
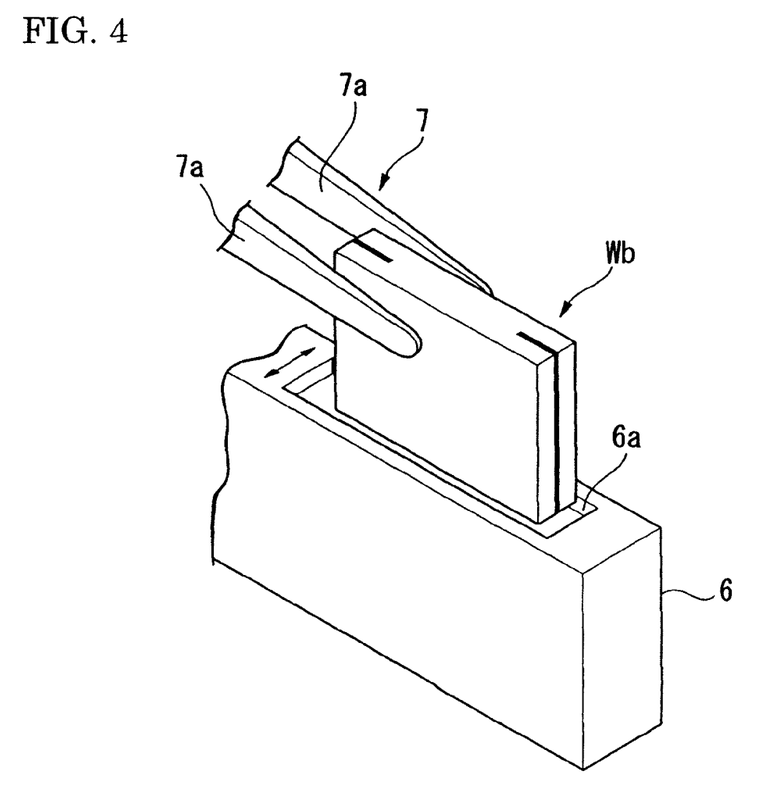
FIG. 4 is a perspective view showing a state in which the sample in the focused ion beam apparatus concerned with the present invention is mounted to a sample holder.

Further, in the vacuum chamber 3, there is provided a manipulator 7 gripping the sample Wb made from the sample substrate Wa and carrying it to the sample holder. The manipulator 7 comprises one pair of arms 7a, 7b, and these arms 7a, 7b are made so as to be controlled in a mutually approaching or separating direction by a drive means like, e.g., a stepping motor or a piezoelectric element (refer to FIG. 4). Incidentally, as explained also in the Background Art, as to the manipulator 7, there are one in which the two arms 7a, 7b are simultaneously driven, and one in which only the arm in one side is driven.

Further, a reference numeral 8 is a secondary electron detector, and it is one detecting secondary electrons emitted from the sample substrate Wa and the like when the focused ion beam is irradiated, e.g., to the sample substrate Wa or the sample Wb from the focused ion beam lens-barrel 1. Further, in the vicinity of the focused ion beam lens-barrel 1, an electron beam lens-barrel 9 and a gas ion beam lens-barrel 10 are disposed such that a difference between their azimuth angles becomes 90 degrees. Incidentally, 11 is a gas gun for discharging a predetermined gas, such as deposition gas, to the sample substrate and the like.

Further, a reference numeral 12 is a control means for controlling an attitude of the sample Wb on the sample holder 5 on the basis of an observation result by the secondary electron detector 8. As to an attitude control of the sample wb at this time, it is considered to move the manipulator 7 by sending, as shown by (a) in FIG. 1, a movement information to the movable manipulator 7 which grips an upper part of the sample Wb while fixing the sample holder 5 under a state in which the lower face of the sample Wb is butted against the sample holder 5, or reversely to move the sample holder 5 side by sending, as shown by (b) in FIG. 1, the movement information to the sample stage 6 while fixing the manipulator 7 gripping the upper part of the sample Wb. In other words, there suffices if the sample holder 5, against which a lower face of the sample Wb is butted, and the manipulator gripping the upper part of the sample Wb are relatively moved.

Concretely, this control means 12 controls the attitude of the sample Wb by finding, when controlling the attitude of the sample Wb, an attitude deviation quantity of the sample on the basis of an observation result of a sample marking by the secondary electron detector 8 by relatively moving parallel the manipulator 7 gripping the upper part of the sample Wb along an installation face of the sample holder 5 with respect to the sample holder under a state in which the lower face of the sample Wb is butted against the sample holder 5, finding, from this attitude deviation quantity, a necessary movement quantity of the manipulator 7, and relatively moving the manipulator 7 in regard to the sample holder 5 on the basis of this necessary movement quantity.

Next, there is explained about the sample relocation method in the charged particle beam apparatus, in which the attitude of the sample when fixing the sample on the sample holder 5 is controlled by gripping the sample Wb on the sample substrate Wa and carrying it to the sample holder 5 by using the above charged particle beam apparatus.

First, the sample Wb is made from the sample substrate Wa. That is, by irradiating the focused ion beam to the surface of the sample substrate Wa, there is made the minute sample Wb having a thickness through which the electron beam for the TEM can transmit. At this time, the sample Wb is completely cut off from the sample substrate Wa and, thereafter, its one part may be bonded to the sample substrate Wa by an adhesive or a deposition, or it may be made under a state in which one part is left.

As shown in FIG. 2, the sample Wb is very minute one whose width S is 14 μm, whose thickness T is 2 μm-3 μm, and whose height H is about 7 μm.

Next, in the chamber 3, the focused ion beam emitted from the focused ion beam lens-barrel 1 is irradiated to a predetermined place of the sample Wb surface under a state bonded to the sample substrate Wa intact, thereby applying a marking as shown in FIG. 3 (a marking process). In FIG. 3, markings Ma, Mb are applied respectively by an etching for instance to both-end central parts in an upper face Wba of the sample and two faces of one-side face Wbb in a thickness direction.

Incidentally, although the marking may exist in any of the surfaces of the sample Wb, it is necessary at least in a side face of the sample Wb, especially in a side face in the thickness direction.

Next, the sample Wb to which the marking was applied is gripped by the manipulator 7 and, under this state, the sample Wb is cut off from the sample substrate Wa by such a means as to irradiate the beam to a required place for instance. And, by driving the sample stage 6 and relatively moving the manipulator in regard to the sample base 4, resultantly the gripped sample Wb is carried from the sample substrate Wa to the sample holder 5.

Next, when fixing the sample Wb to the sample holder 5, the attitude of the sample Wb is controlled while observing the markings Ma, Mb applied to the surface of the sample Wb (an attitude control process). Incidentally, in compliance with a necessity, a groove 6a for holding the sample is previously formed in the sample holder 5. This groove 6a may be formed by irradiating the focused ion beam.

The above attitude control of the sample Wb is concretely performed by doing like the below. That is, by butting a lower face of the sample Wb against the groove 6a of the sample holder 5, and shifting the sample Wb from one position to the other by the manipulator 7, its upper part is gripped. Incidentally, in a case where there is carried with the upper part of the sample Wb being previously gripped by the manipulator 7, there moves to an attitude control operation subsequently to an carriage operation without shifting.

As shown in FIG. 3, as to the attitude control, there are three of an attitude control about an X-axis, an attitude control about a Z-axis, and an attitude control about a Y-axis.

Figure 5A:
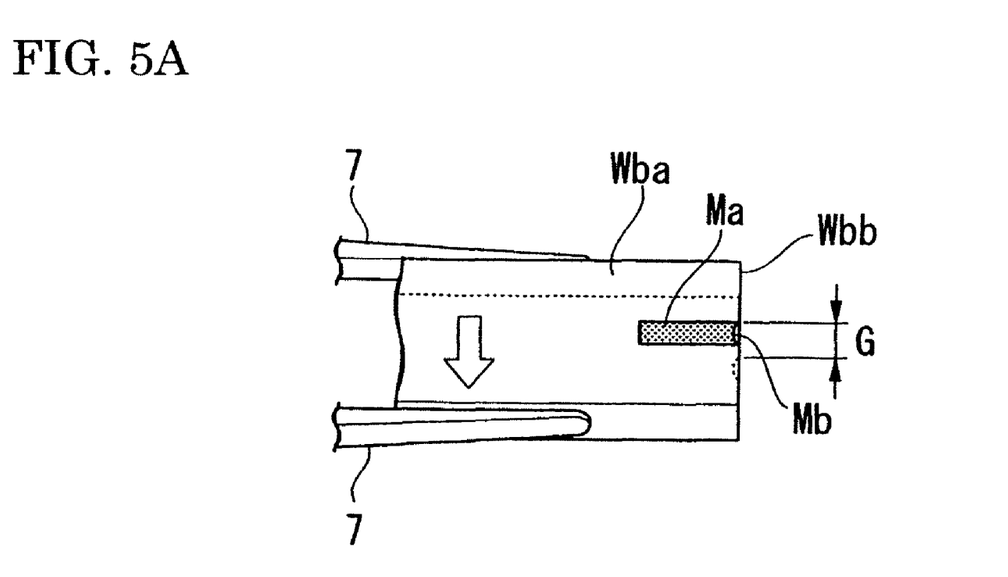
FIGS. 5A and 5B are plan views explaining a sample relocation method in the focused ion beam apparatus concerned with the present invention.

In explaining about the attitude control about the X-axis, first, the marking Mb applied to the one side face Wbb of the sample is observed by the secondary electron detector 8. At this time, when the focused ion beam emitted from the focused ion beam lens-barrel 1, which is the same lens-barrel as when the marking was applied, is irradiated to the sample Wb, the secondary electrons generated from this sample Wb are made ones observed by the secondary electron detector 8. An observation data at that time is sent to the control means 12. If this marking Mb deviated in a longitudinal direction, in the control means 12, its attitude deviation quantity G is found by a method such as image processing. And, in order to correct the deviation of the attitude, a relative, necessary movement quantity in regard to the sample holder 5 of a sample upper part by the manipulator 7 is found, on the basis of that attitude deviation quantity, from a calculation expression or a map, which was previously found. This found data is sent to the sample stage 6 as a control signal. On the basis of the sent control signal, the sample stage 6 moves the sample holder 5. Therefore, as shown in FIG. 5A, it follows that the sample upper part is relatively moved in an arrow direction in regard to the sample holder 5 and, resultantly, the attitude of the sample Wb about the X-axis is controlled.

Figure 5B:
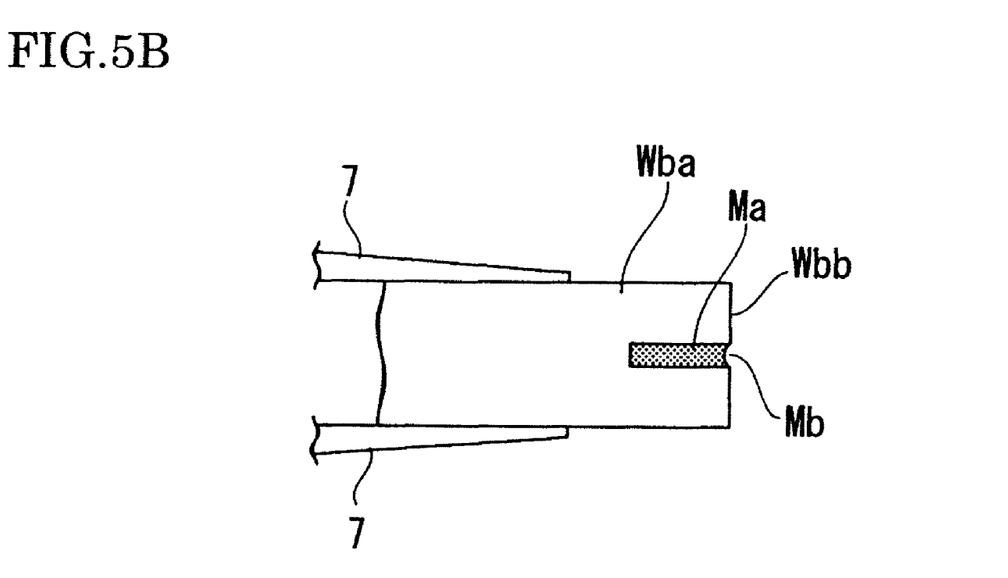

Hereafter, the observation of the marking and the movement of the sample holder 5 by the sample stage 6 are repeated. And, at a time point in which this marking Mb lined up in the longitudinal direction as shown in FIG. 5B, the attitude control of the sample about the X-axis ends.

Figure 6A:
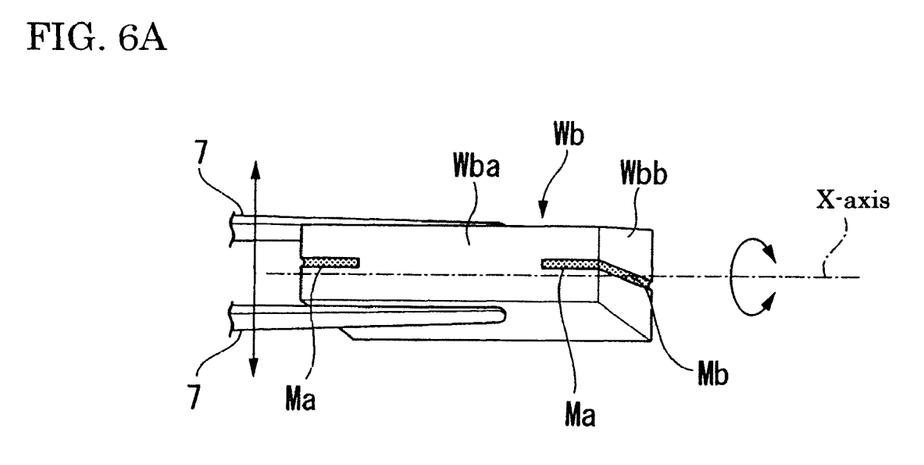
FIGS. 6A and 6B are plan views explaining the sample relocation method in the focused ion beam apparatus concerned with the present invention.

The above explanation is an example in which the sample side face, to which the marking is applied, is formed parallel to the charged particle beam. However, as shown in FIG. 6A, in a case where the one side face Wbb of the sample, to which the marking Mb is applied, is obliquely slanted in regard to the charged particle beam, the attitude control of the sample Wb about the X-axis is performed depending on whether or not the marking Mb applied to the one side face of the sample overlaps on an extended line of the left/right markings Ma applied to the sample upper face.

Figure 6B:
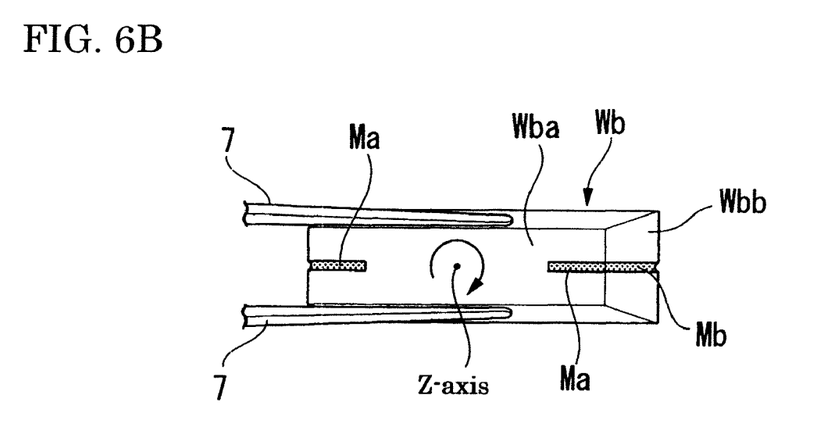

Next, in explaining about the control about the Z-axis, first, the marking Ma applied to the upper face of the sample Wb is observed by the secondary electron detector 8 for instance. The observation data at that time is sent to the control means 12. In the control means 12, there is judged whether or not a line connecting the markings Ma, in two places, applied to the sample upper face becomes parallel to the X-axis of a coordinate system in which this sample stage 6 was placed and, in a case where it does not become parallel, its deviation quantity (attitude deviation quantity) is found by the method such as image processing. And, on the basis of that deviation quantity, in order to correct the deviation of the attitude, a necessary rotation angle of the sample Wb by the manipulator 7 is found from the calculation expression or the map, which was previously found. This found data is sent to the sample stage 6 as a control signal. On the basis of the sent control signal, the sample stage 6 rotates the sample holder 5. Therefore, as shown in FIG. 6B, it follows that the sample is relatively rotated in regard to the sample holder 5 and, resultantly, the attitude of the sample Wb about the Z-axis is controlled.

Hereafter, the observation of the marking and the rotation of the sample holder 5 by the sample stage 6 are repeated. And, at a time point in which a line connecting the markings Ma, in two places, applied to the sample upper face became parallel to the X-axis of the coordinate system in which the sample stage 6 was placed, the attitude control of the sample about the Z-axis ends.

About the attitude control about the Y-axis, since it is basically similar to the attitude control about the X-axis, here its explanation is omitted. Incidentally, in a case where the attitude control about the Y-axis is performed, it is performed on the basis of the marking applied to one side face of the sample in a width direction, although not written in FIGS. 5A-5B and FIGS. 6A-6B.

Incidentally, in a case of this sample, since a length in the width direction is comparatively long, the deviation quantity about the Y-axis is very small, so that the fact that it actually becomes an issue is little.

Further, as to the above attitude controls about X-, Y- and Z-axes, any may be performed first irrespective of their orders. Further, it is needless to perform all of the attitude controls about X-, Y- and Z-axes, and there may be limited to perform, e.g., only the attitude control about the X-axis, or only the attitude controls about the X-axis and the Z-axis. Further, although there is explained about the example in which the attitude control of the sample is automatically performed by using the control means 12, there is not limited to this, and it may be performed by a manual operation.

At a time point in which the attitude control in regard to the sample Wb ended like the above, the sample Wb is bonded to the sample holder 5 by a suitable bonding means such as adhesive or deposition.

According to the sample relocation method mentioned before, since the attitude of the sample Wb on the sample holder 5 is controlled on the basis of the markings Ma, Mb applied under a state placed on the sample substrate Wa, as to the attitude of the sample Wb on the sample holder 5, basically there can be reproduced an attitude under the state placed on the sample substrate Wa.

In other words, for example, on the sample substrate Wa, if the upper face Wba of the sample is perpendicular to the charged particle beam, also on the sample holder 5, it is possible to attitude-control the sample Wb such that the upper face Wba of the sample is held perpendicularly to the charged particle beam.

Therefore, under the same attitude as when there was worked as the sample substrate Wa by the charged particle beam apparatus, the sample substrate Wa can be observed by the TEM for instance. For example, in a case where the sample is an electronic device, since the same positioning as when there was worked can be made, there becomes possible the positioning of a via hole or the like for instance. Further, in compliance with a necessity, by the charged particle beam apparatus, it becomes possible to addition-work the sample Wb existing on the sample holder 5 under a state in which there is held an initial attitude attached to the sample substrate Wa.

In a case where there is addition-worked by the charged particle beam apparatus, there is performed by doing like the below.

That is, here, the focused ion beam lens-barrel 1, the electron beam lens-barrel 9 and the gas ion beam lens-barrel 10 are set such that their axes intersect at one point, and also an actual intersection point of the beams is previously adjusted so as to become one point.

Figure 7:
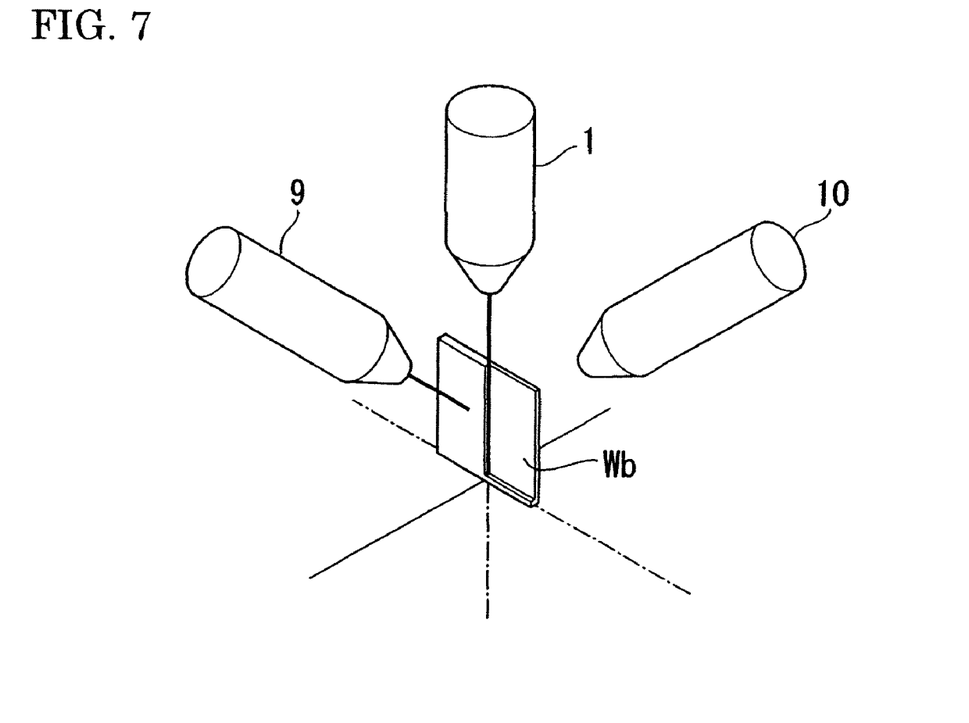
FIG. 7 is a perspective view showing a situation performing an additional working to the sample by a charged particle beam apparatus.

Under this state, as shown in FIG. 7, the ion beam emitted from the focused ion beam lens-barrel 1 is irradiated to the sample Wb, and thereby the sample Wb is made a thin film. At this time, it follows that the ion beam emitted from the focused ion beam lens-barrel 1 impinges against the sample at the same angle as a state in which the sample concerned was originally placed on the sample substrate, so that an ideal film-thinning can be realized.

Incidentally, if the surface of the sample Wb is set so as to become a front of the electron beam lens-barrel 9, since the electron beam from the electron beam lens-barrel 9 impinges against the sample Wb at a deep angle, it is possible to detailedly observe a progress situation of the film-thinning of the sample.

If the film-thinning using the ion beam ends, the sample is rotated in order to perform a finish working by irradiating the gas ion beam from the gas ion beam lens-barrel 10.

Figure 8:
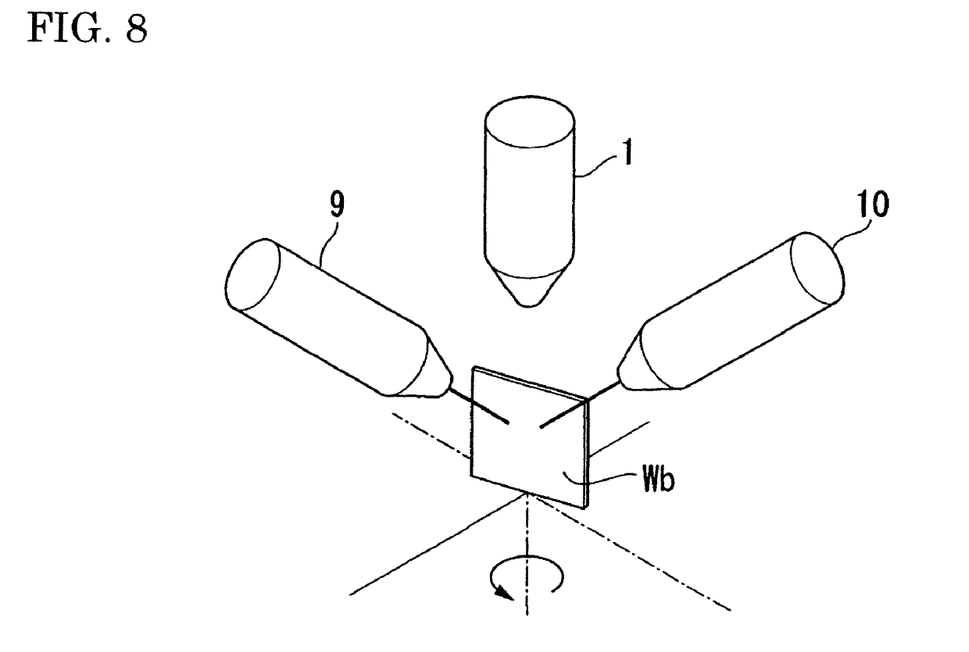
FIG. 8 is a perspective view showing the situation performing the additional working to the sample by the charged particle beam apparatus.

Generally, in the finish working by the gas ion beam, rather when the beam is entered to the sample surface at a shallow angle, it is possible to finish under a good state. On the other hand, the shallower an incident angle is, the longer time is necessary for the finish working of the sample surface. Therefore, by a relation between a time capable of being taken and a quality requested for the sample production, the incident angle is determined. In many cases, there is used the angle of 10 degrees to 20 degrees. Under a state in which the film-thinning working by the focused ion beam lens-barrel 1 was finished, since the incident angle of the gas ion beam from the gas ion beam lens-barrel 10 is 0 degree, there is made so as to be capable of obtaining a desired incident angle by rotating, as shown in FIG. 8, the sample Wb fixed to the sample holder through the sample stage 6. Since the incident angle of the gas ion beam to the sample Wb is the small angle as mentioned above, there is no fact that the incident angle of the electron beam to the sample Wb extremely decreases in comparison with a state of FIG. 7, so that it is possible to observe the progress situation of the finish working of the sample Wb by the gas ion beam without accompanying a movement of the sample stage 6.

In such a case that it is necessary to observe the specified micro part of the semiconductor device etc., since it is frequent that the finish working is gradually advanced while seeing the progress situation, the observation by the electron beam lens-barrel 9 is very important.

By these operations, the additional working to the sample Wb becomes possible.

Incidentally, a technical scope of the present invention is not one limited to the above embodiment, and it is possible to add various modifications in a scope not deviating from a gist of the present invention.

For example, in the above embodiment, although the etching by the ion beam emitted from the focused ion beam lens-barrel 1 is utilized in order to apply the marking by the beam to the sample, there is not limited to this, and the marking may be applied by the deposition. Further, instead of the ion beam emitted from the focused ion beam lens-barrel 1, there may be utilized the electron beam emitted from the electron beam lens-barrel 9, or there may be utilized the ion beam emitted from the gas ion beam lens-barrel 10. In this case, when observing the applied marking, it is desirable to use the beam lens-barrel used when marking and the beam irradiated from the same beam lens-barrel.

Further, in the above embodiment, although the sample stage 6 is made a structure having a movement function along the X-, Y- or Z-axis and a rotation function and, by utilizing this, there are performed the carriage of the sample Wb from the sample substrate Wa to the sample holder 5 and the attitude control of the sample Wb, there is not limited to this, and there may be made such that, by providing, in the manipulator 7 itself, a drive means performing the movement along the X-, Y- or Z-axis, the gripped sample Wb is carried from the sample substrate to the sample holder by this manipulator, and further there may be made such that, by the manipulator having this drive means, the attitude control of the sample Wb is performed on the sample holder 5. Further, there may be made such that a rotation drive system is provided in the manipulator 7 and, by this, the sample Wb is rotated, thereby performing the attitude control.

Further, in the above embodiment, although as the example there is explained the case where the sample separated from the sample substrate Wa such as semiconductor wafer is fixed to the sample holder, there is not limited to this, and the present invention can be applied also to a case where a device of one part of the semiconductor wafer is cut out and this is relocated to a different place.

Further, the present invention can be applied also to a case where a minute structure is cut off and carried from a certain place and, by bonding this with a different, minute structure, a new, minute structure is made.

Additionally, the present invention can be applied also to, e.g., a case where an electron source (chip) worked by the focused ion beam apparatus is installed by being relocated to a cartridge (member necessary for operating the electron source, such as electrode) of the electron source.

What is claimed is:

1. A sample aligning method comprising:
   processing an object with a charged particle beam projector;
   defining a sample in the object at a first location in a coordinate system defined by mutually perpendicular first (I), second (II) and third (III) axes;
   scribing, with the charged particle beam projector, a first line-marking on the sample, which lies in a line of intersection between a I-II plane and a I-III plane in the coordinate system, and a second line-marking on the sample, which lies in a line of intersection between a II-III plane and the I-III plane in the coordinate system;
   transporting the sample off the object to a second location in the coordinate system; and
   aligning the sample at the second location, under observation through an observing device, by a controller which performs at least one of the following processes (a), (b) and (c):
   (a) determining whether one of the first and second line-markings looks from the observing device deviated from the I-III plane; and
      when the one of the first and second line-markings is determined to look from the observing device deviated from the I-III plane, causing the sample to shift along the II axis to thereby shift the one of the first and second line-markings along the II axis until the one of the first and second line-markings looks from the observing device in agreement with the I-III plane,
   (b) determining whether the first and second line-markings look from the observing device linearly continuous to each other; and
      when the first and second line-markings are determined not to look from the observing device linearly continuous to each other, causing the sample to rotate around a line of intersection between a I-II plane and the I-III plane until the first and second line-markings look from the observing device linearly continuous to each other, and
(c) determining whether the first line-marking looks from the observing device parallel to the I-III plane; and
when the first line-marking is determined not to look from the observing device parallel to the I-III plane, causing the sample to rotate around a line of intersection between an II-III plane and the I-III plane until the first line-marking looks from the observing device parallel to the I-III plane.

2. The method according to claim 1, wherein the I, II and III axes represent X, Y and Z axes, respectively.

3. The method according to claim 1, wherein scribing the first and second line-markings on the sample comprises scribing the first and second line-markings under observation through the observing device.

4. The method according to claim 1, further comprising cutting the sample off the object with the charged particle beam projector.

5. The method according to claim 4, wherein cutting the sample off the object after scribing the first and second line-markings on the sample.

6. The method according to claim 1, wherein the observing device is a secondary electron detector that detects secondary electrons excited out from the sample by an irradiation of a charged particle beam from the charged particle beam projector.

7. The method according to claim 6, wherein the determining steps in the processes (a), (b) and (c) each comprise irradiating a charged particle beam from the charged particle beam projector and detecting secondary electrons excited out from the sample by the secondary electron detector.

8. A charged particle beam apparatus for processing an object with a charged particle beam, comprising:
   a charged particle irradiator that cuts a sample off the object at a first location in a coordinate system defined by mutually perpendicular first (I), second (II) and third (III) axes, wherein the charged particle beam irradiator scribes a first line-marking on the sample, which lies in a line of intersection between a I-II plane and a I-III plane in the coordinate system, and a second line-marking on the sample, which lies in a line of intersection between a II-III plane and the I-III plane in the coordinate system;
   a manipulator that transports the sample off the object to a second location in the coordinate system;
   an observing device that detects positions and orientations of the first and second line-markings of the sample positioned at the second location; and
   a controller that aligns the sample at the second location by performing at least one of the following processes (a), (b) and (c):

(a) determining whether one of the first and second line-markings looks from the observing device deviated from the I-III plane; and
when the one of the first and second line-markings is determined to look from the observing device deviated from the I-III plane, causing the sample to shift along the II axis to thereby shift the one of the first and second line-markings along the II axis until the one of the first and second line-markings looks from the observing device in agreement with the I-III plane,
(b) determining whether the first and second line-markings look from the observing device linearly continuous to each other; and
when the first and second line-markings are determined not to look from the observing device linearly continuous to each other, causing the sample to rotate around a line of intersection between a I-II plane and the I-III plane until the first and second line-markings look from the observing device linearly continuous to each other, and
(c) determining whether the first line-marking looks from the observing device parallel to the I-III plane; and
when the first line-marking is determined not to look from the observing device parallel to the I-III plane, causing the sample to rotate around a line of intersection between an II-III plane and the I-III plane until the first line-marking looks from the observing device parallel to the I-III plane.

9. The apparatus according to claim 8, wherein the I, II and III axes represent X, Y and Z axes, respectively.

10. The apparatus according to claim 8, wherein the charged particle beam projector scribes the first and second line-markings on the sample under observation through the observing device.

11. The apparatus according to claim 8, wherein the observing device is a secondary electron detector that detects secondary electrons excited out from the sample by an irradiation of a charged particle beam from the charged particle beam projector.

12. The apparatus according to claim 11, wherein in each of the processes (a), (b) and (c), the charged particle beam projector irradiates a charged particle beam to the sample, and the secondary electron detector detects secondary electrons excited out from the sample to detect the positions and orientations of the first and second line-markings of the sample.

13. The apparatus according to claim 8, further comprising a sample stage located at the second location on which the sample is transported from the object, wherein the sample stage is movable in the coordinate system, and the sample stage and the manipulator, either independently or in combination, moves and rotates the sample in the coordinate system under control of the controller.

* * * * *